US006914261B2

(12) United States Patent
Ho

(10) Patent No.: US 6,914,261 B2
(45) Date of Patent: Jul. 5, 2005

(54) LIGHT EMITTING DIODE MODULE

(75) Inventor: Wen-Chih Ho, Taoyuan (TW)

(73) Assignee: Lambda Opto Technology Co., Ltd., Taoyuan (TW)

(*) Notice: Subject to any disclaimer, the term of this patent is extended or adjusted under 35 U.S.C. 154(b) by 63 days.

(21) Appl. No.: 10/682,439

(22) Filed: Oct. 10, 2003

(65) Prior Publication Data

US 2005/0077839 A1 Apr. 14, 2005

(51) Int. Cl.[7] .................................................. H01L 27/15
(52) U.S. Cl. .......................... 257/79; 257/99; 315/169.3
(58) Field of Search ........................... 315/169.1, 169.3, 315/291; 257/94–99, 79, 103

(56) References Cited

U.S. PATENT DOCUMENTS 5,608,234 A * 3/1997 Jiang ........................... 257/94
6,809,341 B2 * 10/2004 Hsu et al. ..................... 257/79

* cited by examiner

*Primary Examiner*—Tuyet Vo
*Assistant Examiner*—Jimmy Vu
(74) *Attorney, Agent, or Firm*—Rabin & Berdo, P.C.

(57) ABSTRACT

A light emitting diode (LED) module illuminates under application of an electrical current for use in an electrical device as a light source. The LED module includes a plurality of epitaxy chips, an electrode set, and a substrate having good electrical insulation and good heat dissipation. The epitaxy chips, formed by cutting an epitaxy wafer, are mounted on the substrate. The LED module has good heat dissipation properties, thereby improving its illumination performance. The electrodes are arranged so that the illuminating area of the LED module is not shielded and can achieve full-area illumination through a large illumination area.

20 Claims, 8 Drawing Sheets

LIGHT EMITTING DIODE MODULE

BACKGROUND OF THE INVENTION

1. Field of Invention

The invention relates to a light emitting diode (LED) module as the light source of an electronic device, including an epitaxy chip, an electrode, and a substrate with good insulation and good heat dissipation. More particularly, the invention relates to an LED module having a plurality of epitaxy chips on a single substrate after the epitaxy chips have been cut, the eptiaxy chip having good heat dissipation, high brightness and full-area illumination.

2. Related Art

The development of LED technology began in 1970. For decades, people have looked for an effective means of illumination. However, various factors such as brightness and durability of the illumination products have limited their success in commercialization. With LED technology, some of these problems have been successfully solved, and LEDs are now widely used in illumination devices. Compared to traditional light sources, the LED has advantages such as small size, good illumination efficiency, long service life, high response speed, high reliability, and good wear resistance. LEDs allow the production of small, flexible or array-shaped devices, without heat radiation or pollution by toxic substances such as silver.

Nowadays, LED technology has become mature, and has found a wide range of applications such as in vehicle dashboards, as the backlight source of liquid crystal display devices, as interior illumination, and as the light source of scanners or fax machines, etc. However, technical developments are needed to manufacture a LED that has low power consumption, high efficiency and high brightness.

Many LED structures have been proposed in the past but most of which focus on illumination properties. The prior art particularly emphasizes technical improvement with respect to illumination efficiency and brightness, by optimally arranging the LEDs according to rectangular or circular distributions so as to increase the illumination area. LED assembly according to these distribution schemes is problematic because the LEDs are separately formed on a substrate. LED rearrangement according to a desired distribution is time-consuming and complicates the manual and mechanical assembly process. When an illumination device uses LEDs as its light source, the heat generated from the operation of the LEDs is also a concern.

Tolerance to power consumption also plays an important role in LED illumination performance. If the LED can tolerate high power consumption, its brightness increases. Thermal factors also constitute an important characteristic of the LED. Heat dissipation can be achieved via various packaging structures. The heat irradiated from the LED in operation is dissipated via an external means such as an airtight mask provided with a liquid or gas filled therein, so that the LED can tolerate high power consumption without property alterations. Although such external means achieves heat dissipation, it adds a processing step to the manufacturing process. Furthermore, the external heat dissipation means may increase the burden for product quality testing.

SUMMARY OF THE INVENTION

An object of the invention is therefore to provide an LED module with good heat dissipation efficiency, large illumination area and full-area illumination.

Another object of the invention is to provide an LED module with a large illumination area and full-area illumination, the LED being suitable for use as the light source of an illumination device.

The LED module includes a plurality of epitaxy chips, a plurality of electrode sets, and a substrate with good electrical insulation and heat dissipation. The epitaxy chips, formed by cutting an epitaxy wafer, are mounted on the substrate. The LED module has high heat dissipation efficiency, thereby increasing its performance. The electrodes are arranged in such a manner that the illuminating area of the LED module is not shielded by the electrodes to obtain a full area of illumination.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 2 and 2-1 are schematic views of an electrical layout of an LED module according to an embodiment of the invention;

FIGS. 3 and 3-1 are schematic views of an epitaxy chip in an LED module according to an embodiment of the invention;

FIGS. 4, 4-1, 4-2, 4-3, 4-4 and 4-5 are schematic views of an epitaxy chip mounted on electrodes according to an embodiment of the invention;

FIG. 5 is a schematic view of an LED module according to a first embodiment of the invention;

DETAILED DESCRIPTION OF THE INVENTION

Figure 1:
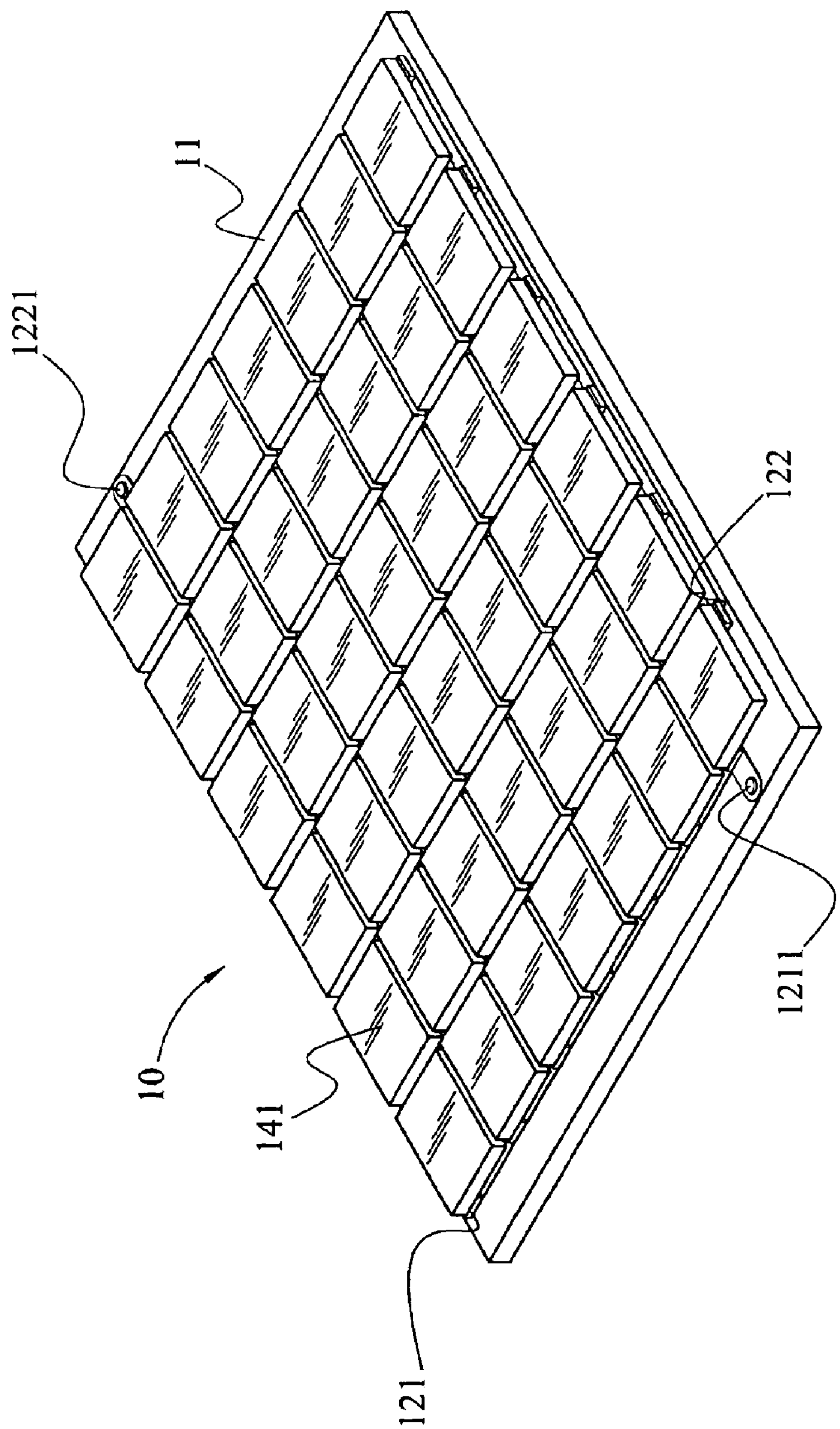
FIG. 1 is a perspective view of an LED module according to an embodiment of the invention.

Referring to FIG. 1, an LED module 10 includes a heat dissipating substrate 11, a plurality of p-type electrodes 121, a plurality of n-type electrodes 122 and a plurality of epitaxy chips 141. One p-type electrode junction 1211 and one n-type electrode junction 1221 are respectively formed at an edge of the substrate 11. The electrodes 121 and 122 are formed on one side of the substrate 11. The cut epitaxy chips 141 are arranged in an array to increase the light-emitting area and the illumination of the module. The p-type electrode junction 1211 and the n-type electrode junction 1221 formed at the edge of the substrate 10 allow the LED module 10 to be accommodated in an electronic device such as the light source of an electronic illumination device.

Figure 2:
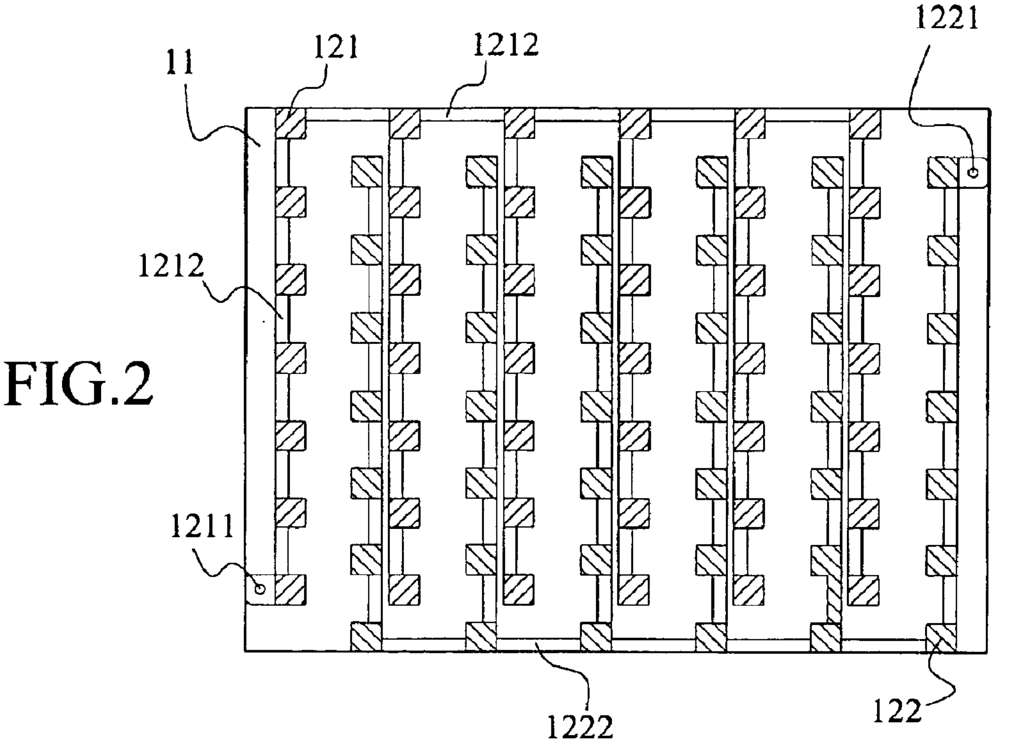
Figures 1, 2:
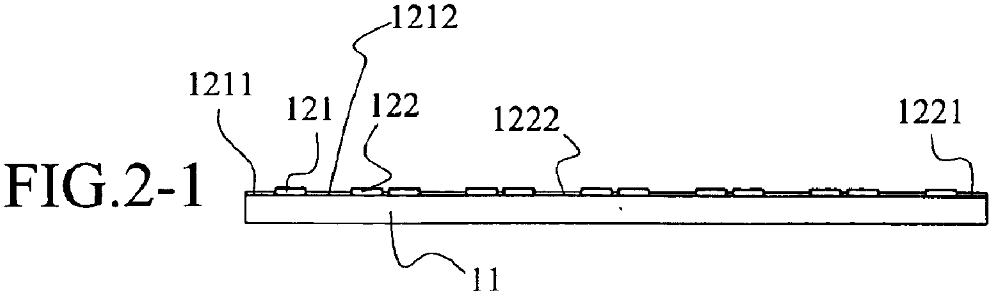

FIG. 2 is a schematic view of the electric layout on the substrate 11 of the module 10. Electrode sets 12 are uniformly distributed over the substrate 11. Each set of electrodes 12 includes a p-type electrode 121 and an n-type electrode 122. The electrode sets 12 are arranged in an array of 7*6. In other words, 7*6=42 epitaxy chips 141 (as shown in FIG. 1) are distributed over the single substrate 11. The number of epitaxy chips on the single substrate can be varied depending on diverse applications. For example, 6*5=30 or other numbers of epitaxy chips can be arranged in rectangular, circular, triangular or irregularly shaped arrays. As illustrated, the p-type electrodes 121 electrically connect to one another in series via connecting lines 1212. The p-type electrodes 121 connect to one another via a connecting line 1212 to form an "ON" circuit in an electrically conducting status. The n-type electrodes 122 connect to one another in series via a connecting line 1222 to form an "ON" circuit in an electrically conducting status. With the connection of the electrodes in series via the connecting lines 1212 and 1222, the electrodes are divided into two groups: a group of p-type electrodes and a group of n-type electrodes. The distribution of p-type electrodes connecting to one another via the connecting line 1212 extends to the edge of the substrate 11 to reach the p-type junction 1211. Similarly, the distribution of n-type electrodes connecting to one another via the connecting line 1222 extends to the edge of the substrate 11 to reach the n-type junction 1221. FIG. 2-1 is a side view of a layout of the electrodes and the connecting lines on the substrate 11. Because the p-type electrodes 121 and the n-type electrodes 122 have to be respectively attached to the epitaxy chips 141, the epitaxy chips 141 protrude from the substrate 11 at a height greater than the connecting lines 1212 and 1222.

Figure 3:
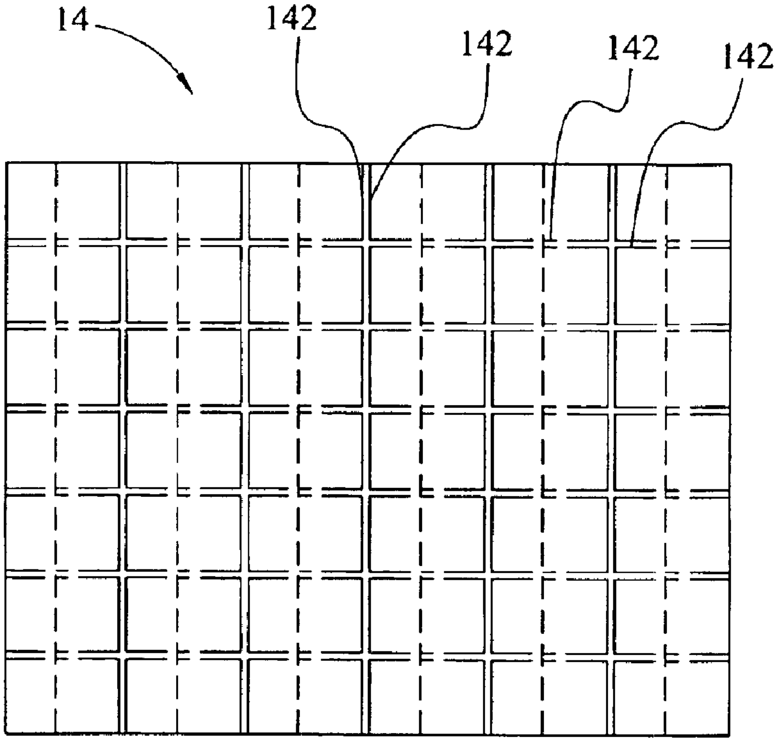
Figures 1, 3:
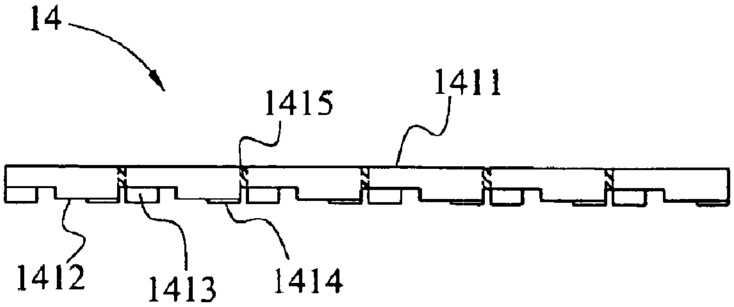

Referring to FIGS. 3 and 3-1, an uncut epitaxy wafer has an upper surface as its main light-emitting surface. First metal bumps 1413 and second metal bumps 1414 are mounted on the lower surface 1412 of the epitaxy chip 14. Mounting the metal bumps 1413 and 1414 on the lower surface of the wafer is achieved by plating, evaporating, or sputtering processes. In FIG. 3, sawing lines 142 are equally spaced. The redundant portions 1415 between two adjacent sawing lines 142 are removed after a subsequent cutting process.

Figure 4:
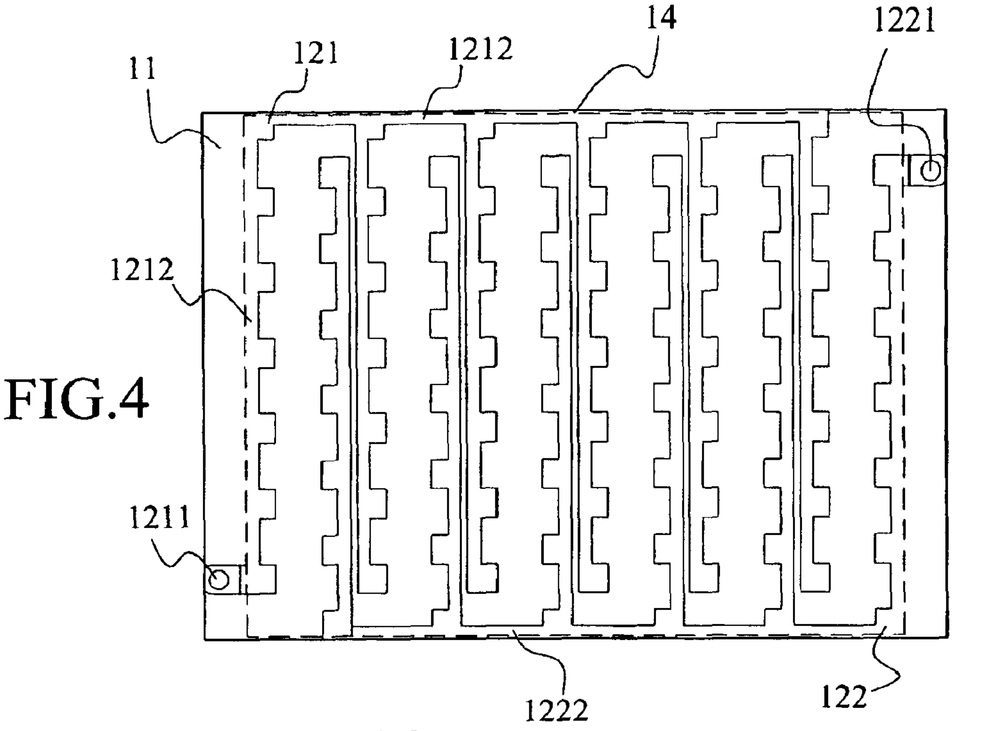
Figures 1, 4:
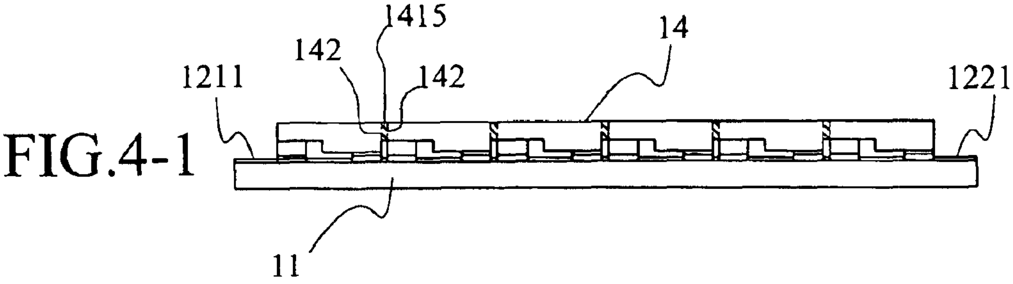
Figures 2, 4:
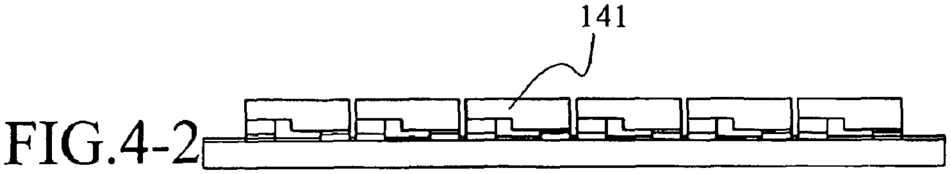
Figures 3, 4:
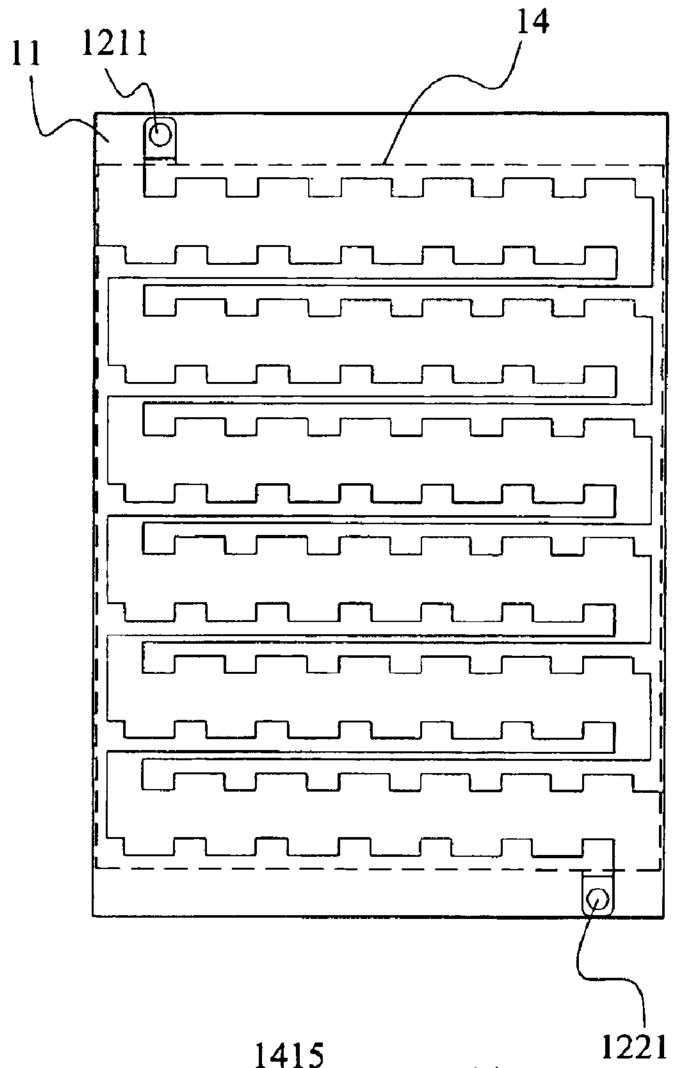
Figure 4:
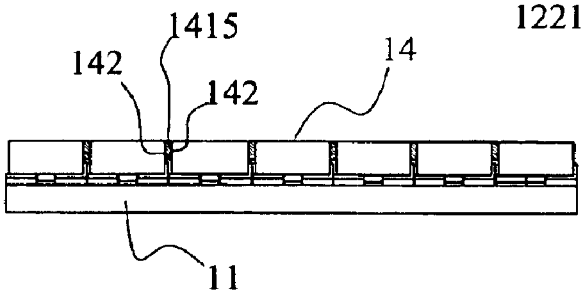

Referring to FIGS. 4 and 4-1, the epitaxy wafer 14 is mounted on the substrate 11 so that the first metal bumps 1413 and the second metal bumps 1414 on the lower flat surface 1412 of the epitaxy wafer 14 respectively align with the p-type electrodes and the n-type electrodes. After the alignment process, the bumps are respectively attached on the electrodes by soldering, welting or ultrasonic melting, as shown in FIGS. 4-1.

Referring to FIGS. 4-2, the epitaxy wafer 14 is cut into epitaxy chips 141 along the sawing lines 142. The redundant portions 1415 of the epitaxy wafer 14 between two adjacent sawing lines 142 are removed, as shown in FIGS. 4-2. Each epitaxy chip 141 is attached to one set of electrodes 12, including one p-type electrode 121 and one n-type electrode 122. With the attachment of the epitaxy chips 141 to the corresponding electrodes and the connection of the epitaxy chips 141 to one another via connecting lines 1212 and 1222, the epitaxy chips form an "ON" circuit in an electrically conducting status. As illustrated, the set of electrodes 12 to which the epitaxy chips 141 are attached are mounted on the lower flat surface 1412 of the substrate 11. There is no obstruction to the illumination of the epitaxy chips 141 on the main emitting surface 1411. Therefore, when the electrodes are electrically conducting, there is no loss of illumination. Furthermore, the heat generated during illumination effectively dissipates through the substrate 11. The substrate used in the LED module is made of ceramics, aluminum oxide, aluminum nitride, or a combination thereof, to promote thermal dissipation.

Figures 4, 5:
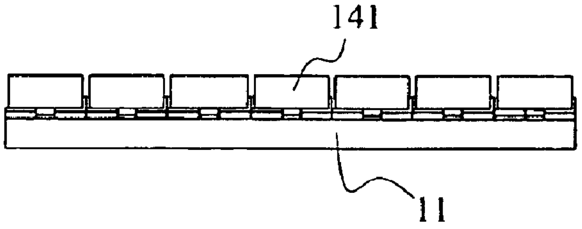
Figure 5:
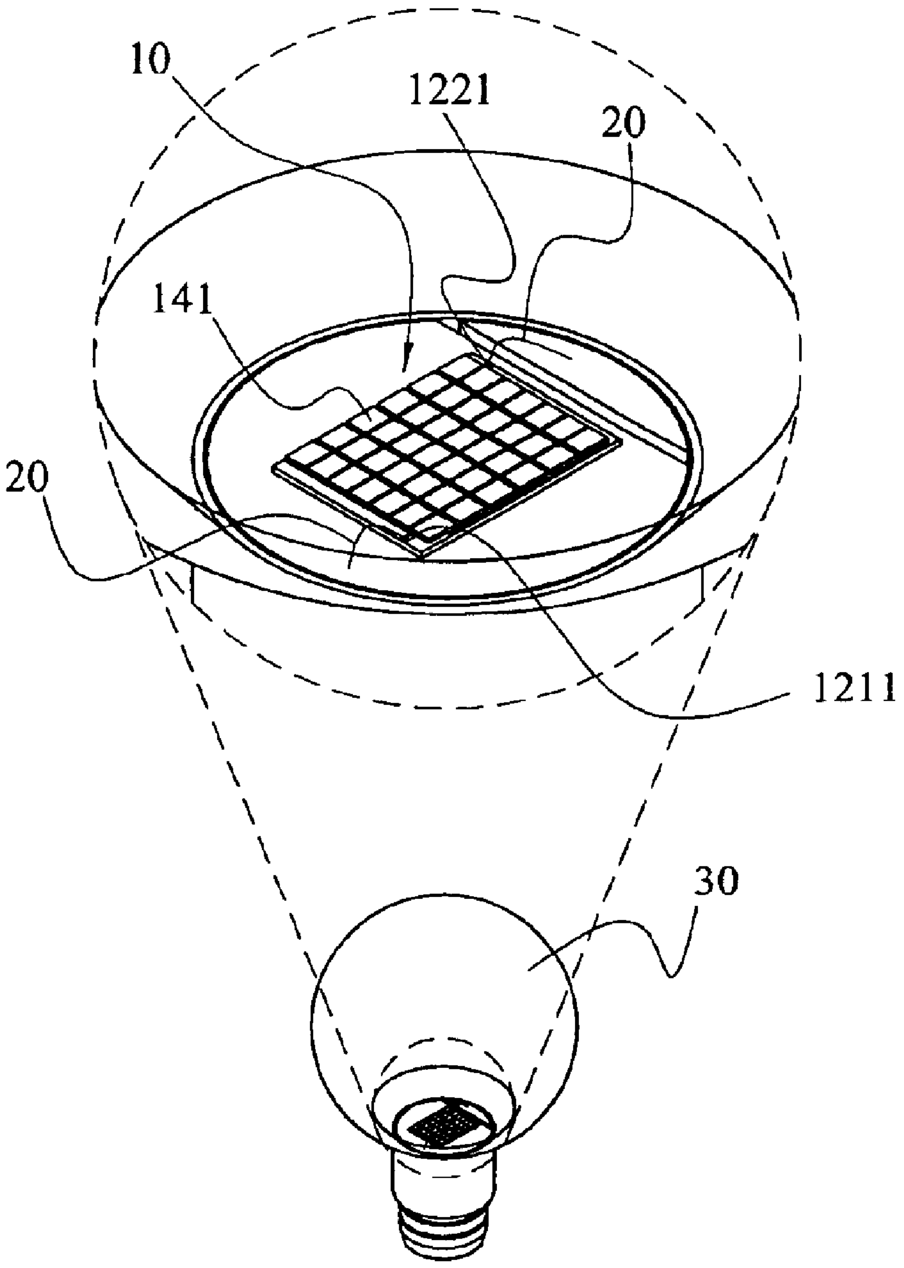

FIGS. 4-3, 4-4 and 4-5 are side views illustrating the epitaxy wafer of the LED module before being cut, with another viewing angle. Referring to FIG. 4-4, cutting is performed along the sawing lines 142, removing the redundant portions 1415. Thereafter, the epitaxy wafer 14 is cut into epitaxy chips 141.

Each of the cut epitaxy chips 141 has the structure shown in FIG. 1, e.g. they include a heat dissipating substrate 11 having electrode sets 12 thereon. The epitaxy chips 141 are respectively mounted on the electrode sets 12 to form an LED array. Each LED includes one epitaxy chip, one set of electrodes and a heat dissipating substrate. The LEDs connect to one another in series, or both in series and parallel to form an LED module. Under application of an electrical current, each eptiaxy chip on the substrate illuminates over a large illumination area. The LED module of the invention is further characterized by the epitaxy wafer being attached to the electrodes of the substrate via metal bumps. The epitaxy wafer is mounted on the electrodes of the substrate before being cut, and forms a plurality of epitaxy chips after the cutting process. Alternatively, the wafer can be cut before being mounted on the electrodes of the substrate.

An LED module 10 may be used in illumination equipment. Referring to FIG. 5, which is a first embodiment of the invention, the LED module 10 is mounted in a light bulb 30 as a light source. Two metal wires 20 respectively connect to the p-type electrode junction 1211 and the n-type electrode junction 1221 to complete the electrical connection of the bulb 30. With an electrical current, the bulb 30 illuminates with low power consumption, low pollution and long service life.

Figure 6:
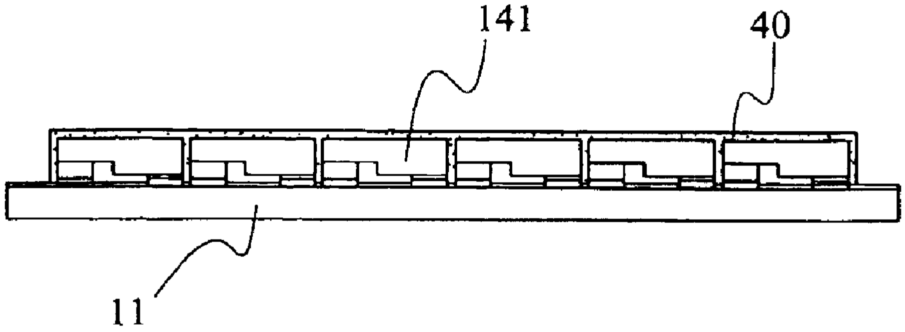
FIG. 6 is a schematic view of an LED module according to a second embodiment of the invention.

Referring to FIG. 6, which illustrates a second embodiment of the invention for dashboard application, a light hybrid layer 40 is applied over the epitaxy chips 141 to emit a specific color of light such as white light. The color light may be obtained by mixing lights of different wavelengths. The light hybrid layer 40 may encapsulate each epitaxy chip 141 so that when the epitaxy chips 141 illuminate, the light coming from the epitaxy chips 141 and transmitting through the light hybrid layer 40 excites the light hybrid layer 40 to create light of a different wavelength. Thereby, a hybrid light is generated via mixing lights of different wavelengths. The light hybrid layer is formed of refracting particles, fluorescent particles or scattering particles. The material for the refracting particles includes quartz, glass or a transparent polymer. The scattering particles are made of a material selected from one or more of titanium barium oxide, titanium oxide, silicon oxide, silicon dioxide, barium sulfate or calcium carbonate. The fluorescent particles are made of, for example, an inorganic fluorescence material.

Figure 7:
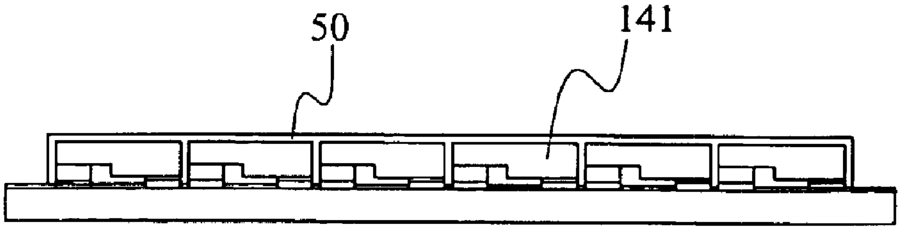
FIG. 7 is a schematic view of an LED module according to a third embodiment of the invention.

FIG. 7 illustrates a third embodiment of the invention. A fluorescent layer 50 is applied over the epitaxy chips 141 to encapsulate each epitaxy chip 141. Light from the epitaxy chips 141 emits on the fluorescent layer 50 on the epitaxy chips to excite the fluorescent layer 50 and generate another light of another wavelength. The light emitting from the eptiaxy chips 141 mixes with the light excited from the light hybrid layer 50 to form a different light color. The organic fluorescent material can be varied according to the desired light color. For example, when the fluorescent layer 50 is made of a nitride based material in which yttrium aluminum garnet (YAG) powders are distributed, the mixed light is typically a white light.

Figure 8:
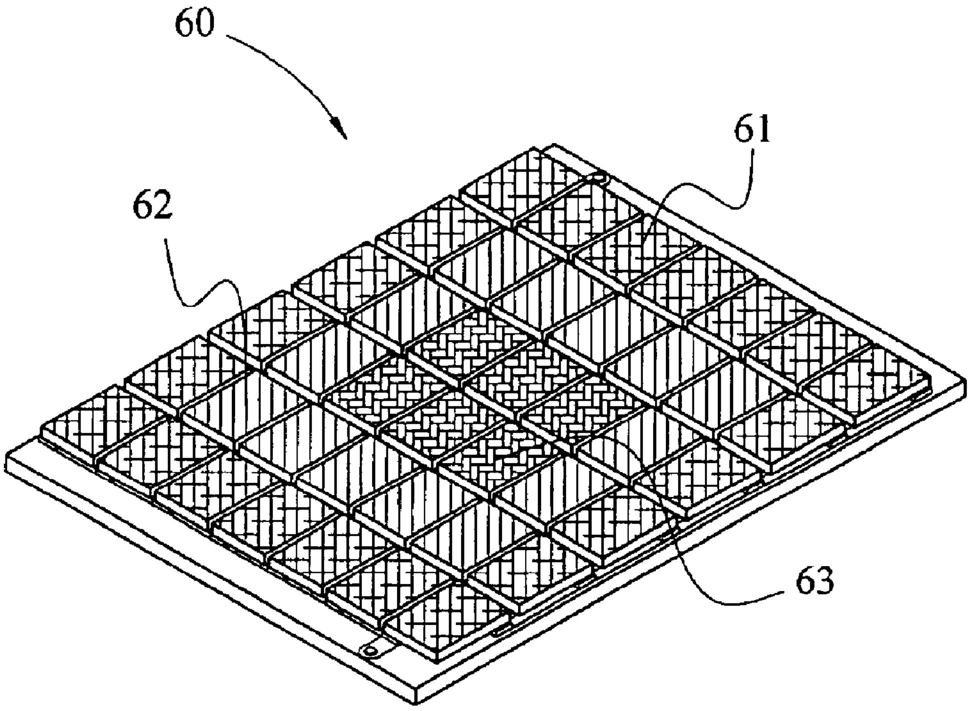
FIG. 8 is a schematic view of an LED module according to a fourth embodiment of the invention.

Referring to FIG. 8, which illustrates a fourth embodiment of the invention, the LED module may combine more than one type of chip to generate light of more than one wavelength. After a packaging process has been completed, the lights of different wavelengths mix together to generate a hybrid light. The LED module 60, as shown in FIG. 8, includes three types of epitaxy chips, e.g. a first epitaxy chip 61, a second epitaxy chip 62 and a third epitaxy chip 63. These three chips are formed of different materials. Under application of an electrical current, the three chips respectively emit different colored light. After the packaging process has been completed, the different light colors mix together to form a hybrid light. The color of the hybrid light is based on the color-mixing principle of RGB primary colors, and may be, for example, white.

As described above, the LED module of the invention provides the following advantages:

1. A plurality of epitaxy chips is formed on a single substrate, thereby increasing the illumination area.
2. The epitaxy chips are arranged in the form of a module that can be mounted inside an electric device for intense illumination.
3. Heat generated from the epitaxy chips can be effectively dissipated to the substrate through the electrodes. The substrate made of a thermally conductive material promotes rapid heat conduction out of the substrate, which improves heat dissipation of the LED module and its tolerance to high power consumption.
4. P-type or n-type electrodes mounted on the lower surface of the epitaxy chip minimize light shielding of the illuminating surface. Full-area illumination over the illuminating surfaces can thereby be achieved.

The LED module of the invention provides full-area illumination on a substantially large area. Therefore, it is suitable for use in illumination devices as a light source.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting diode (LED) module, illuminating under application of an electrical current for use in an electrical device as a light source, the LED module comprising:

a heat dissipating substrate, having plural electrode sets, each of the electrode sets including an p-type electrode and an n-type electrode, the p-type electrodes electrically connecting to one another and extending to a first edge of the substrate to reach a p-type junction, the n-type electrodes connecting to one another and extending to a second edge of the substrate to reach an n-type junction; and a plurality of epitaxy chips, each having an upper illuminating surface, each of the electrode sets being attached to a lower surface of each of the epitaxy chips, the epitaxy chips electrically connecting to one another via the electrode sets to form a LED module which illuminates with a large illuminating area.

2. The LED module of claim 1, wherein the material for the heat dissipating substrate is selected from the group consisting of ceramic, aluminum oxides, and aluminum nitrides.

3. The LED module of claim 1, wherein the p-type electrodes connect to one another in series, in parallel, or both in series and parallel.

4. The LED module of claim 1, wherein the electrode sets are respectively attached to the epitaxy chips according to a rectangular or circular distribution.

5. The LED module of claim 1, wherein the attachment of the epitaxy chips to the electrode sets are achieved by either cutting an epitaxy wafer into a plurality of epitaxy chips, and then placing the individual epitaxy chips on the electrode sets, or by placing an epitaxy wafer on the electrode sets and then cutting the epitaxy wafer into a plurality of epitaxy chips.

6. The LED module of claim 1, wherein the epitaxy chips are formed of one of two different materials, and are mounted on the electrode sets to generate lights of different wavelengths under application of an electrical current.

7. A light emitting diode (LED) module, illuminating under application of an electrical current for use in an electrical device as a light source, the LED module comprising:

a heat dissipating substrate, having plural electrode sets, each of the electrode sets including an p-type electrode and an n-type electrode, the p-type electrodes electrically connecting to one another and extending to a first edge of the substrate to reach a p-type junction, the n-type electrodes connecting to one another and extending to a second edge of the substrate to reach an n-type junction; and a plurality of epitaxy chips, each having an upper illuminating surface provided with a light hybrid layer thereon, each of the electrode sets being attached to a lower surface of each of the epitaxy chips, the epitaxy chips electrically connecting to one another via the electrode sets to form a LED module, the upper illuminating surface emitting a light of a first wavelength to excite the light hybrid layer and generate a light of a second wavelength, the light of the first wavelength being mixed with the light of the second wavelength to form a hybrid light.

8. The LED module of claim 7, wherein the material for the heat dissipating substrate is selected from the group consisting of ceramic, aluminum oxides and aluminum nitrides.

9. The LED module of claim 7, wherein the p-type electrodes connect to one another in series, in parallel, or both in series and parallel.

10. The LED module of claim 7, wherein the electrode sets are respectively attached to the epitaxy chips according to a rectangular or circular distribution.

11. The LED module of claim 7, wherein the attachment of the epitaxy chips to the electrode sets are achieved by either cutting an epitaxy wafer into a plurality of epitaxy chips and then placing individual epitaxy chips on the electrode sets, or by placing an epitaxy wafer on the electrode sets and then cutting the epitaxy wafer into a plurality of epitaxy chips.

12. The LED module of claim 7, wherein the light hybrid layer is formed of diffraction particles, fluorescent particles or scattering particles.

13. The LED module of claim 7, wherein the material for the diffraction particles is selected from the group consisting of quartz, glass and transparent polymer.

14. The LED module of claim 7, wherein the scattering particles are formed of a material selected from a group consisting of titanium barium oxide, titanium oxide, silicon oxide, silicon dioxide, barium sulfate and calcium carbonate.

15. A light emitting diode (LED) module, illuminating under application of an electrical current for use in an electrical device as a light source, the LED module comprising:

a heat dissipating substrate, having plural electrode sets, each of the electrode sets including an p-type electrode and an n-type electrode, the p-type electrodes electrically connecting to one another and extending to a first edge of the substrate to reach a p-type junction, the n-type electrodes connecting to one another and extending to a second edge of the substrate to reach an n-type junction; and a plurality of epitaxy chips, each having an upper illuminating surface provided with a fluorescent layer thereon, each of the electrode sets being attached to a lower surface of each of the epitaxy chips, the epitaxy chips electrically connecting to one another via the electrode sets to form a LED module, the upper illuminating surface emitting a light of a first wavelength to excite the fluorescent layer and generate a light of a second wavelength, the light of the first wavelength being mixed with the light of the second wavelength to form a white light.

16. The LED module of claim 15, wherein the material for the heat dissipating substrate is selected from the group consisting of ceramic, aluminum oxides and aluminum nitrides.

17. The LED module of claim 15, wherein the p-type electrodes connect to one another in series, in parallel, or both in series and parallel.

18. The LED module of claim 15, wherein the electrode sets are respectively attached to the epitaxy chips according to a rectangular or circular distribution.

19. The LED module of claim 15, wherein the attachment of the epitaxy chips to the electrode sets are achieved by either cutting an epitaxy wafer into a plurality of epitaxy chips and then placing individual epitaxy chips on the electrode sets, or by placing an epitaxy wafer on the electrode sets and then cutting the epitaxy wafer into a plurality of epitaxy chips.

20. The LED module of claim 15, wherein the fluorescent layer is formed of yttrium aluminum garnet (YAG).

* * * * *